(12) United States Patent
Peng et al.

(10) Patent No.: US 12,519,012 B2
(45) Date of Patent: Jan. 6, 2026

(54) SEMICONDUCTOR STRUCTURE AND MANUFACTURING METHOD THEREOF

(71) Applicant: YANGTZE MEMORY TECHNOLOGIES CO., LTD., Wuhan (CN)

(72) Inventors: Jin Peng, Wuhan (CN); Ziqun Hua, Wuhan (CN); Zuhui Zheng, Wuhan (CN); Zheng Xiang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 499 days.

(21) Appl. No.: 17/982,001

(22) Filed: Nov. 7, 2022

(65) Prior Publication Data
US 2023/0065123 A1   Mar. 2, 2023

Related U.S. Application Data

(63) Continuation of application No. PCT/CN2021/115692, filed on Aug. 31, 2021.

(51) Int. Cl.
*H01L 21/768* (2006.01)
*H01L 23/532* (2006.01)
*H01L 23/535* (2006.01)

(52) U.S. Cl.
CPC .... *H01L 21/7682* (2013.01); *H01L 21/76805* (2013.01); *H01L 21/76895* (2013.01); *H01L 23/5329* (2013.01); *H01L 23/535* (2013.01)

(58) Field of Classification Search
CPC ........... H01L 21/7682; H01L 21/76805; H01L 21/76895; H01L 23/5329
See application file for complete search history.

(56) References Cited

U.S. PATENT DOCUMENTS 5,017,509 A * 5/1991 Tuckerman ............. H01P 3/081
                                                         438/668
6,159,840 A * 12/2000 Wang ................ H01L 21/76808
                                                         438/618

(Continued)

FOREIGN PATENT DOCUMENTS

CN      102769017 A      11/2012
CN      103337474 A  *   10/2013

(Continued)

*Primary Examiner* — Laura M Menz
(74) *Attorney, Agent, or Firm* — BAYES PLLC

(57) ABSTRACT

A semiconductor structure manufacturing method includes forming a base having a substrate and a dielectric layer on the substrate; forming a first metal layer on the base, the first metal layer has a plurality of first metal lines spaced apart from each other and partially covers the base; forming a dielectric landing layer to cover top surfaces and sidewalls of the plurality of first metal lines; forming a hollow dielectric layer on the dielectric landing layer between adjacent first metal lines; forming an interlayer dielectric layer to cover top surfaces of the hollow dielectric layer and the dielectric landing layer; etching the interlayer dielectric layer and the dielectric landing layer to form a plurality of trenches that expose the plurality of first metal lines; and depositing a metal material in the plurality of trenches to form a second metal layer.

18 Claims, 5 Drawing Sheets

(56) References Cited

U.S. PATENT DOCUMENTS

| | | | | |
|---|---|---|---|---|
| 6,214,719 B1* | 4/2001 | Nag | H01L 21/7682 | 438/622 |
| 6,949,456 B2* | 9/2005 | Kumar | H01L 21/76835 | 438/619 |
| 9,607,882 B2* | 3/2017 | Lin | H01L 21/764 | |
| 9,653,348 B1* | 5/2017 | Wu | H01L 21/31144 | |
| 9,837,355 B2* | 12/2017 | Briggs | H01L 21/76879 | |
| 10,032,711 B2* | 7/2018 | Basker | H01L 23/5223 | |
| 10,157,778 B2* | 12/2018 | Tsai | H01L 23/5283 | |
| 10,199,325 B2* | 2/2019 | Yim | H01L 21/76897 | |
| 10,304,734 B2* | 5/2019 | You | H01L 21/76811 | |
| 10,361,157 B2* | 7/2019 | Briggs | H01L 21/76877 | |
| 10,373,905 B2* | 8/2019 | Basker | H01L 23/5223 | |
| 10,541,206 B2* | 1/2020 | Briggs | H01L 21/02271 | |
| 11,004,790 B2* | 5/2021 | Briggs | H01L 21/76877 | |
| 11,244,857 B2* | 2/2022 | Tsai | H01L 21/7682 | |
| 11,735,524 B2* | 8/2023 | Briggs | H01L 21/02271 | 257/774 |
| 12,211,738 B2* | 1/2025 | Tsai | H01L 21/7682 | |
| 2002/0098673 A1* | 7/2002 | Yeh | H01L 21/76831 | 438/618 |
| 2003/0213617 A1* | 11/2003 | Karthikeyan | H01L 23/53295 | 174/258 |
| 2009/0001594 A1* | 1/2009 | Yoo | H01L 23/5222 | 257/773 |
| 2009/0072409 A1* | 3/2009 | Nitta | H01L 23/522 | 257/E23.141 |
| 2010/0133648 A1* | 6/2010 | Seidel | H01L 21/76849 | 257/E21.573 |
| 2011/0193230 A1* | 8/2011 | Nogami | H01L 21/7682 | 257/E21.585 |
| 2013/0323930 A1* | 12/2013 | Chattopadhyay | H01L 21/76829 | 156/345.26 |
| 2014/0151888 A1* | 6/2014 | Tsai | H01L 21/76834 | 438/622 |
| 2016/0225716 A1* | 8/2016 | Lu | H01L 21/31144 | |
| 2017/0278740 A1* | 9/2017 | Briggs | H01L 21/76897 | |
| 2017/0278788 A1* | 9/2017 | Briggs | H01L 21/31116 | |
| 2017/0278796 A1* | 9/2017 | Briggs | H01L 21/76831 | |
| 2017/0317025 A1* | 11/2017 | Briggs | H01L 21/31116 | |
| 2017/0345706 A1* | 11/2017 | Tsai | H01L 23/53295 | |
| 2018/0019203 A1* | 1/2018 | Conti | H01L 23/53295 | |
| 2018/0025974 A1* | 1/2018 | Basker | H01L 21/76837 | 257/534 |
| 2018/0033691 A1* | 2/2018 | You | H01L 23/53295 | |
| 2018/0151490 A1* | 5/2018 | Yim | H01L 21/76834 | |
| 2018/0233446 A1* | 8/2018 | Basker | H01L 23/5223 | |
| 2018/0330987 A1* | 11/2018 | You | H01L 21/76811 | |
| 2019/0096742 A1* | 3/2019 | Tsai | H01L 23/53295 | |
| 2020/0013718 A1* | 1/2020 | Briggs | H01L 23/53271 | |
| 2021/0391262 A1* | 12/2021 | Chang | H10D 64/251 | |
| 2021/0407908 A1* | 12/2021 | Huang | H10B 12/34 | |
| 2022/0139762 A1* | 5/2022 | Li | H01L 21/02063 | 257/774 |
| 2022/0148970 A1* | 5/2022 | Su | H01L 21/76825 | |
| 2022/0157647 A1* | 5/2022 | Tsai | H01L 23/5283 | |
| 2022/0173041 A1* | 6/2022 | Su | H01L 21/76844 | |
| 2022/0181260 A1* | 6/2022 | Huang | H01L 21/76805 | |
| 2022/0181261 A1* | 6/2022 | Huang | H01L 23/53266 | |
| 2022/0216094 A1* | 7/2022 | Clampitt | H01L 23/5329 | |
| 2022/0262671 A1* | 8/2022 | Li | H01L 23/535 | |
| 2023/0065123 A1* | 3/2023 | Peng | H01L 21/76834 | |
| 2023/0109118 A1* | 4/2023 | Ai | H01L 23/5222 | 257/773 |
| 2023/0420566 A1* | 12/2023 | Jao | H10D 30/024 | |
| 2024/0014133 A1* | 1/2024 | Briggs | H01L 23/53271 | |
| 2024/0038586 A1* | 2/2024 | Cheng | H01L 23/5329 | |
| 2024/0194590 A1* | 6/2024 | Ai | H01L 21/7682 | |
| 2024/0332067 A1* | 10/2024 | Li | H01L 23/5222 | |
| 2025/0118596 A1* | 4/2025 | Tsai | H01L 23/53295 | |
| 2025/0125192 A1* | 4/2025 | Dutta | H01L 21/76834 | |

FOREIGN PATENT DOCUMENTS

| | | | | |
|---|---|---|---|---|
| CN | 103839884 A | | 6/2014 | |
| CN | 106486418 A | | 3/2017 | |
| CN | 106935544 A | | 7/2017 | |
| CN | 103337474 B | * | 8/2017 | |
| CN | 107665855 A | * | 2/2018 | H01L 21/76811 |
| CN | 107993979 A | * | 5/2018 | H01L 21/7682 |
| CN | 109585363 A | * | 4/2019 | H01L 23/528 |
| CN | 109950199 A | * | 6/2019 | |
| CN | 113939905 A | * | 1/2022 | H01L 21/76837 |
| CN | 114284209 A | * | 4/2022 | |
| CN | 116936467 A | * | 10/2023 | H10D 64/258 |
| CN | 107665855 B | * | 11/2023 | H01L 21/764 |
| DE | 102016114912 B4 | * | 11/2021 | H01L 23/5222 |
| KR | 20140028908 A | * | 3/2014 | H01L 21/7682 |
| WO | WO-2023028843 A1 | * | 3/2023 | H01L 21/7682 |

* cited by examiner

SEMICONDUCTOR STRUCTURE AND MANUFACTURING METHOD THEREOF

CROSS-REFERENCES TO RELATED APPLICATIONS

This application is a continuation of International Application No. PCT/CN2021/115692, filed on Aug. 31, 2021, which is incorporated herein by reference in its entirety.

TECHNICAL FIELD

The present disclosure relates to the field of semiconductor technology, and particularly to a semiconductor structure and a manufacturing method thereof.

BACKGROUND

In the back end of line (BEOL) of a semiconductor process, trenches of overlying metal lines are typically over-etched to ensure the electric connection between the overlying metal lines and corresponding underlying metal lines.

However, due to the increasingly smaller critical dimension (CD) of semiconductors, the size of metal lines and spacing between adjacent metal lines in the same layer are becoming increasingly smaller. In the process of etching trenches of the overlying metal lines, deviations would occur between the trench and the location of the corresponding underlying metal line, which would damage the air gap between the adjacent underlying metal lines, thereby impacting the reliability of the semiconductor structure.

SUMMARY

In one aspect, a method for forming a semiconductor structure includes the following operations. Forming a base that has a substrate and a dielectric layer on the substrate. Forming a first metal layer on the base, and the first metal layer has a plurality of first metal lines spaced apart from each other and partially covers the base. Forming a dielectric landing layer to cover top surfaces and sidewalls of the plurality of first metal lines. Forming a hollow dielectric layer on the dielectric landing layer between adjacent first metal lines. Forming an interlayer dielectric layer to cover top surface of the hollow dielectric layer and the dielectric landing layer. Etching the interlayer dielectric layer and the dielectric landing layer to form a plurality of trenches that expose the plurality of first metal lines. Depositing a metal material in the plurality of trenches to form a second metal layer that has a plurality of second metal vias.

In some implementations, forming the hollow dielectric layer includes forming a plurality of air gaps, and each one the plurality of air gaps is positioned between two adjacent first metal lines.

In some implementations, each of the plurality of first metal lines has a first end in contact with the base and a second end in contact with the dielectric landing layer, the first end has a first cross-sectional area, the second end has a second cross-sectional area, and the first cross-sectional area is small than the second cross-sectional area.

In some implementations, none of the plurality of second metal vias extends into any one of the plurality of air gaps.

In some implementations, a bottom surface of at least one of the plurality of second metal vias is at least partially landed on the dielectric landing layer.

In some implementations, a first subset of the plurality of second metal vias are in contact with the plurality of first metal lines.

In some implementations, a second subset of the plurality of second metal vias deviate from contacting the plurality of first metal lines, and the plurality of second metal vias are in contact with the dielectric landing layer.

In some implementations, the interlayer dielectric layer has a same material as the hollow dielectric layer.

In some implementations, the interlayer dielectric layer has a different material as the hollow dielectric layer.

In another aspect, a method for forming a semiconductor structure includes the following operations. Forming a base that has a substrate and a dielectric layer on the substrate. Forming a first metal layer on the base, and the first metal layer has a plurality of first metal lines spaced apart from each other and partially covers the base. Forming a first dielectric landing layer to cover top surfaces and sidewalls of the plurality of first metal lines. Forming a second dielectric landing layer to cover the first dielectric landing layer. Forming a hollow dielectric layer on the second dielectric landing layer between adjacent first metal lines. Forming an interlayer dielectric layer to cover top surfaces of the hollow dielectric layer and the second dielectric landing layer. Etching the interlayer dielectric layer, the first dielectric landing layer, and the second dielectric landing layer to form a plurality of trenches that expose the plurality of first metal lines. Depositing a metal material in the plurality of trenches to form a second metal layer that has a plurality of second metal vias.

In some implementations, forming the hollow dielectric layer comprises forming a plurality of air gaps, and each one of the plurality of air gaps is positioned between two adjacent first metal lines.

In some implementations, each of the plurality of first metal lines has a first end in contact with the base and a second end in contact with the first dielectric landing layer, the first end has a first cross-sectional area, the second end has a second cross-sectional area, and the first cross-sectional area is smaller than the second cross-sectional area.

In some implementations, under a same etching condition, the interlayer dielectric layer has an etch rate larger than that of the first dielectric landing layer, and the second dielectric landing layer has an etch rate larger than that of the first dielectric landing layer.

In some implementations, none of the plurality of second metal vias extends into any one of the plurality of air gaps.

In some implementations, a bottom surface of at least one of the plurality of second metal vias is at least partially landed on the first dielectric landing layer.

In some implementations, a first subset of the plurality of second metal vias are in contact with the plurality of first metal lines.

In some implementations, the interlayer dielectric layer has a same material as the hollow dielectric layer.

In yet another aspect, a semiconductor structure includes a base having a substrate and a dielectric layer on the substrate; a first metal layer disposed on the base, and the first metal layer has a plurality of first metal lines spaced apart from each other and partially covers the base; a dielectric landing layer covering top surfaces and sidewalls of the plurality of first metal lines; a hollow dielectric layer on the dielectric landing layer between adjacent first metal lines; an interlayer dielectric layer covering top surfaces of the hollow dielectric layer and the dielectric landing layer; a plurality of trenches extending vertically through the interlayer dielectric layer and the dielectric landing layer;

and a second metal layer having a plurality of metal vias inside the plurality of trenches.

In some implementations, the hollow dielectric layer comprises a plurality of air gaps and each one of the plurality of air gaps is positioned between two adjacent first metal lines.

BRIEF DESCRIPTION OF THE DRAWINGS

In order to illustrate technical solutions of the present disclosure more clearly, drawings are used in the description of various implementations conceived in accordance with the present disclosure. Drawings in the following description are only some implementations of the present disclosure. In view of them, other drawings can be figured out by those skilled in the art without any creative works.

DETAILED DESCRIPTION

Figure 1:
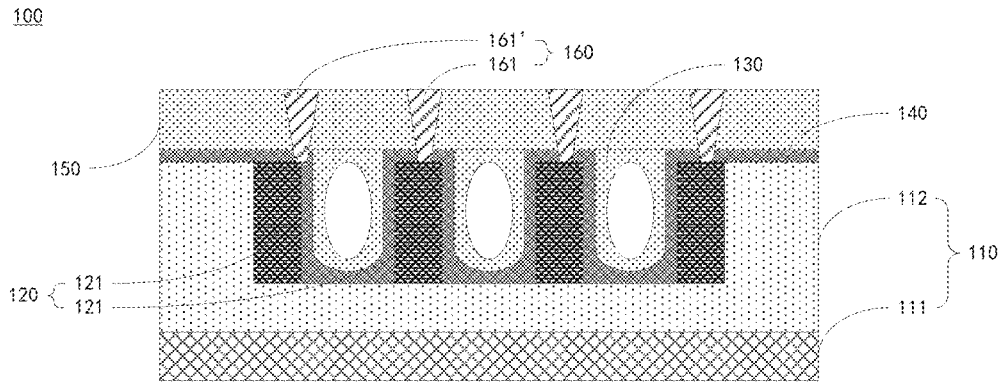
FIG. 1 is a sectional structure diagram of a semiconductor structure provided in a first implementation of the present disclosure.

The technical solutions in implementations of the present disclosure will be described below in connection with accompanying drawings in implementations of the present disclosure. The described implementations are only a part of implementations of the present disclosure rather than all of them. Based on the implementations of the present disclosure, other implementations obtained by those skilled in the art without any creative work fall within the protection scope of the present disclosure.

In the description of the present disclosure, it is understood that the orientations and position relationships indicated by terms "center", "longitudinal direction", "lateral direction", "length", "width", "thickness", "upper", "lower", "front", "back", "left", "right", "vertical", "horizontal", "top", "bottom", "inner", "outer", "clockwise", and "anti-clockwise" etc. are the orientations and position relationships indicated based on the drawings and only for the convenience of describing the present disclosure and simplifying the description, rather than indicating or implying that the apparatuses or elements referred to must have particular orientations, or be constructed or operated in particular orientations. As a result, they should not be understood as limitations for the present disclosure. Moreover, the terms "first" and "second" are only used for the purpose of description and should not be understood to indicate or imply relative importance or designate implicitly the number of the technical features indicated. Therefore, a feature defined as "first" or "second" may include explicitly or implicitly one or more of the described features. In the description of the present disclosure, "a plurality of" means two or more unless specifically defined otherwise.

In the description of the present disclosure, it is to be noted that terms "mounted", "interconnected" and "connected", unless otherwise specified or defined expressly, should be explained broadly, and may be, for example, fixed connection, removable connection or integral connection; they may be a mechanical connection, electrical connection, or may be in communication with each other; they may be in direct interconnection or interconnection with intermediate medium; they may have inner communication or interaction between two elements. The specific meanings of the above-mentioned terms in the present disclosure can be understood by those of ordinary skills in the art depending on specific circumstances.

In the present disclosure, a first feature being "on" or "under" a second feature may include the first feature being in direct contact with the second feature or may include the first feature being not in direct contact with the second feature, but being in contact through another feature therebetween, unless otherwise specified or defined expressly. Moreover, a first feature being "on", "over" or "above" a second feature includes the first feature being directly over and obliquely over the second feature or only means that the first feature is at a higher level than the second feature. A first feature being "under", "below" or "beneath" a second feature includes the first feature being directly below and obliquely below the second feature or only means that the first feature is at a lower level than the second feature.

A number of different implementations or examples are provided in the following disclosure to achieve different structures in the present disclosure. To simplify the disclosure of the present disclosure, components and configurations of specific examples will be described in the following. They are only exemplary and not intended to limit the present disclosure. Moreover, the present disclosure may repeat reference numerals and/or letters in the various examples. The repetition is for the purpose of simplicity and clarity and does not in itself dictate a relationship between the various implementations and/or configurations discussed. Moreover, although examples of various specific processes and materials are provided in the present disclosure, it can be realized by those of ordinary skills in the art that other processes may be used and/or materials may be used.

In a process of etching trenches of overlying metal lines, when a deviation occurs between the trench and the location of the corresponding underlying metal line, it would damage the air gap between the adjacent underlying metal lines, thereby impacting the reliability of a semiconductor structure. The implementations of the present disclosure are aimed to address the above-mentioned problem.

Referring to FIG. 1, which shows a structure diagram of a semiconductor structure 100 provided in the first implementation of the present disclosure. Constituent parts and relative position relationships among the constituent parts according to the first implementation of the present disclosure can be seen in the figure intuitively.

As shown in FIG. 1, the semiconductor structure 100 includes a base 110, a first metal layer 120, a hollow dielectric layer 130, and a dielectric landing layer 140.

The base 110 includes a substrate 111 and a dielectric layer 112 on the substrate 111. The material for the substrate 111 may be single crystalline silicon (Si), single crystalline germanium (Ge) or silicon germanium (GeSi), silicon carbide (SiC), or may be silicon-on-insulator (SOI), germanium-on-insulator (GOI), or may be other materials, for example, III-V compounds such as Galium Arsenide.

The first metal layer 120 is disposed on the base 110 and includes a plurality of first metal lines 121 spaced apart from each other. An example material for the first metal lines 121 is tungsten (W). Each of the first metal line 121 has a first end in contact with the base 100 and a second end away from the base 100. In some implementations, the first end has a cross-sectional area smaller than that of the second end.

The hollow dielectric layer 130 is disposed on the base 110 and located between adjacent first metal lines 121. It is to be noted that the hollow dielectric layer 130 may be also called the air gap. Since the dielectric constant of air is far below that of oxide, a hollow dielectric layer 130 is typically formed instead of filling oxide between first metal lines 121, thereby improving RC delay between metal lines (with R: resistance, C: capacitance).

The dielectric landing layer 140 is disposed between the first metal layer 120 and the hollow dielectric layer 130 and between the part of the base 110 and the hollow dielectric layer 130. It is to be noted that the dielectric landing layer 140 serves as a protection layer for the hollow dielectric layer 130 between adjacent first metal lines 121. When any alignment deviation occurs while etching metal via trenches over the first metal layer 120 such that the metal via trench corresponding to the first metal line 121 have only parts falling over the first metal line 121, for example as the second metal via 161' shown in FIG. 1, the semiconductor structure 100 provided in the present implementation may ensure that another part of the second metal via 161' will fall on the dielectric landing layer 140 between adjacent first metal lines 121, thereby not damaging the hollow dielectric layer 130 between adjacent first metal lines 121, hence guaranteeing the reliability of the semiconductor structure 100.

It is to be noted that in this implementation, the hollow dielectric layer 130 has a first step coverage and the dielectric landing layer 140 has a second step coverage, wherein the first step coverage is smaller than the second step coverage. That is, since the dielectric landing layer 140 has a better step coverage, it is easier for the dielectric landing layer 140 to be deposited over the first metal lines 121 and sides of the first metal lines 121, thereby facilitating protecting the hollow dielectric layer 130; while since the hollow dielectric layer 130 has a worse step coverage, it is difficult for the material of the hollow dielectric layer 130 to be deposited between adjacent first metal lines 121, thereby facilitating forming the hollow structures (i.e. air gaps) of the hollow dielectric layer 130.

Further, in an example according to the present disclosure, each of the first metal lines 121 has a first end 121-1 in contact with the base and a second end 121-2 in contact with the dielectric landing layer. The first end has a first cross-sectional area, the second end has a second cross-sectional area, and the first cross-sectional area is smaller than the second cross-sectional area. That is, in this variant example, the first metal line has a structure that is wide at the top and narrow at the bottom, so that the material of the hollow dielectric layer 130 is difficult to flow into adjacent first metal lines 121 when forming the hollow dielectric layer 130, thereby facilitating the formation of hollow structures (i.e., air gaps).

Further, referring to FIG. 1, in this implementation, the semiconductor structure 100 further includes an interlayer dielectric layer 150 and a second metal layer 160.

The interlayer dielectric layer 150 may cover the first metal layer 120, the hollow dielectric layer 130, and the dielectric landing layer 140. In this implementation, the interlayer dielectric layer 150 has a material the same as the hollow dielectric layer 130. In other implementations, the interlayer dielectric layer 150 has a material different from the hollow dielectric layer 130. It is to be noted that in other variant examples according to the present disclosure, the interlayer dielectric layer may use other materials with better step coverage.

The second metal layer 160 includes a plurality of second metal vias 161 that penetrate through the interlayer dielectric layer 150 and the dielectric landing layer 140 to be in connection with the corresponding first metal lines 121.

It is to be noted that in this implementation, the interlayer dielectric layer 150 has a material different from the dielectric landing layer 140 such that, under the same etching conditions, etch speed for the interlayer dielectric layer 150 is faster than that for the dielectric landing layer 140. That is, the etch selectivity ratio between the interlayer dielectric layer 150 and the dielectric landing layer 140 is greater than 1. In an exemplary implementation according to the present disclosure, the first metal line has a structure with a wide top and narrow bottom as described above (that is, the first metal line is an inverted trapezoidal and, in this case, the hollow dielectric layer between adjacent first metal lines is a regular trapezoidal with a narrow top and wide bottom). When the trenches of the second metal vias are over etched in order to ensure that the second metal vias are connected with the corresponding first metal lines and the alignment deviation occurs between the second metal vias and the corresponding first metal lines, since they are now under the environment of etching the interlayer dielectric layer, while the etch solution reaches the dielectric landing layer, the etch speed slows down, which makes impossible for the trenches of the second metal vias to sink into the dielectric landing layer too much, and the inverted trapezoidal structure of the first metal lines makes impossible for the trenches of the second metal vias to contact the hollow dielectric layer between the first metal lines, thereby protecting the hollow dielectric layer.

In some implementations, the material for the dielectric landing layer 140 includes, but not limited to silicon nitride (SiN), silicon nitride carbide (SiCN), silicon (Si), and other substances containing carbon.

Figure 2:
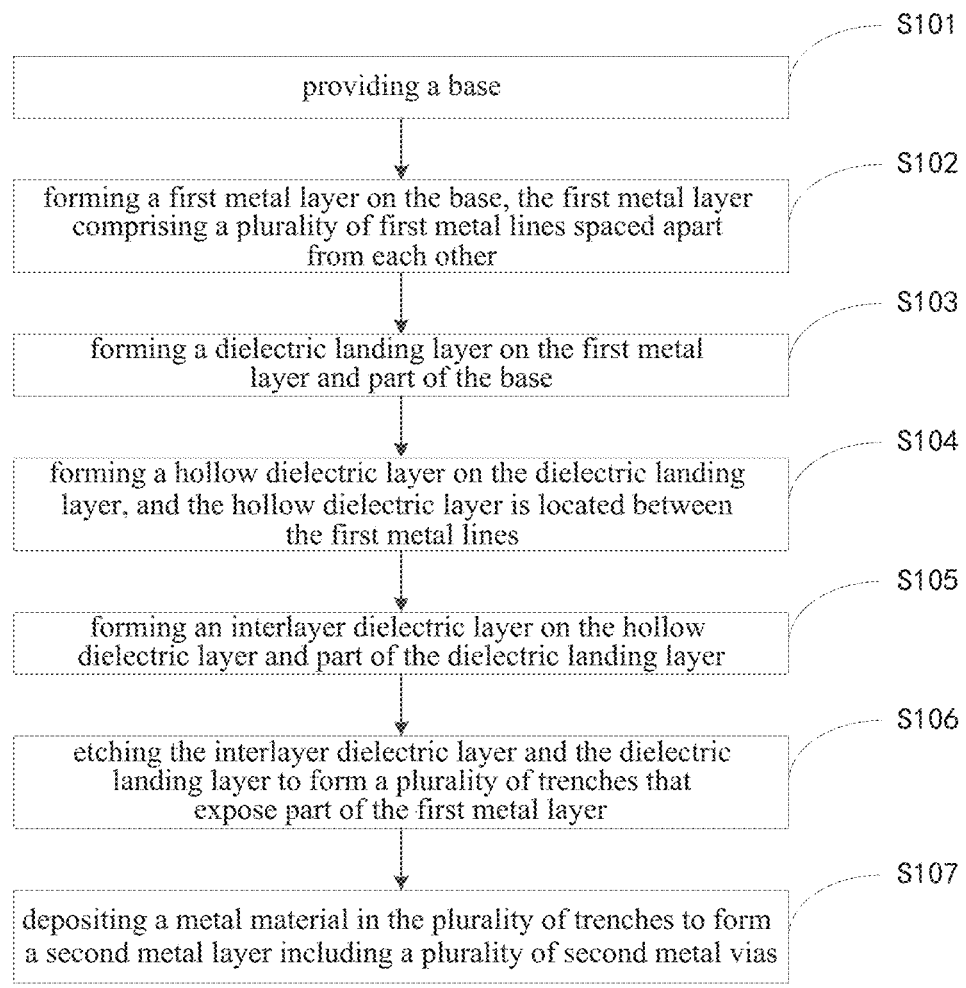
FIG. 2 is a flow chart of a manufacturing method of the semiconductor structure provided in the first implementation of the present disclosure.
Figure 3A:
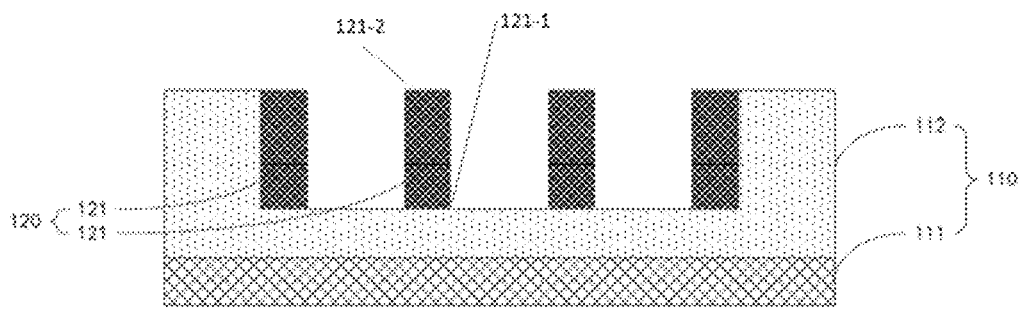
FIGS. 3a-3d are process flow charts of a manufacturing method of the semiconductor structure provided in the first implementation of the present disclosure.
Figure 3B:
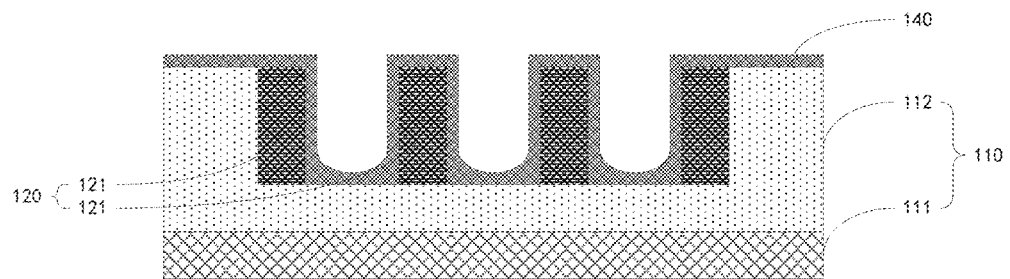
Figure 3C:
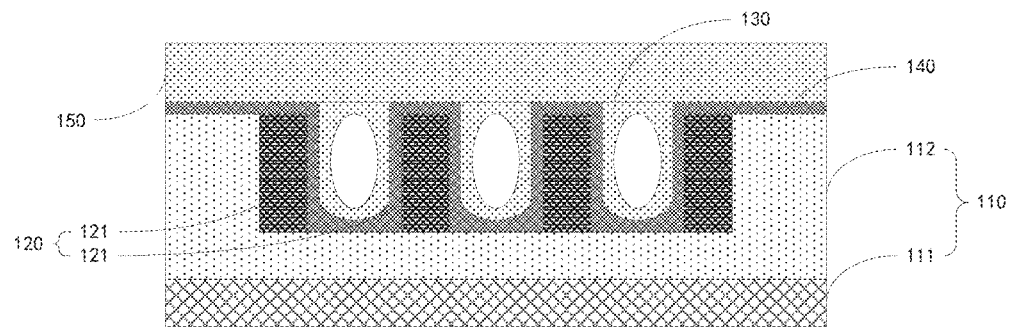
Figure 3D:
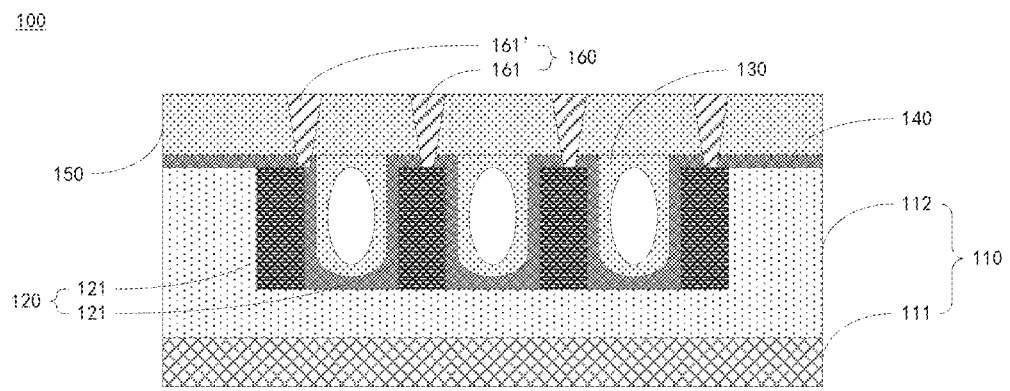

Referring to FIGS. 2 and 3a-3d, FIG. 2 is a flow chart of a manufacturing method of the semiconductor structure 100 provided in the first implementation of the present disclosure, and FIGS. 3a-3d are process flow charts of the manufacturing method of the semiconductor structure 100 provided in the first implementation of the present disclosure. As shown in FIG. 2, the manufacturing method of the semiconductor structure 100 includes a base providing step S101: providing a base 110; a first metal layer forming step S102: forming a first metal layer 120 on the base 110, the first metal layer 120 including a plurality of first metal lines 121 spaced apart from each other; a dielectric landing layer forming step S103: forming a dielectric landing layer 140 on the first metal layer 120 and part of the base 110; a hollow dielectric layer forming step S104: forming a hollow dielectric layer 130 on the dielectric landing layer 140, and the hollow dielectric layer 130 is located between the first metal lines 121; an interlayer dielectric layer forming step S105: forming an interlayer dielectric layer 150 on the hollow dielectric layer 130 and part of the dielectric landing layer 140; a trench etching step S106: etching the interlayer dielectric layer 150 and the dielectric landing layer 140 to form a plurality of trenches that expose part of the first metal layer 120; a second metal layer forming step S107: depositing metal material in the plurality of trenches to form a second metal layer 160 including a plurality of second metal vias 161.

The present disclosure provides a semiconductor structure 100 including: a base 110; a first metal layer 120 disposed on the base 110 and including a plurality of first metal lines 121 spaced apart from each other; a hollow dielectric layer 130 disposed on the base 110 and located between the first metal lines 121; and a dielectric landing layer 140 disposed between the first metal layer 120 and the hollow dielectric layer 130 and between part of the base 110 and the hollow dielectric layer 130. In some implementations, each of the first metal line 121 has a first end 121-1 in contact with the base and a second end 121-2 in contact with the dielectric landing layer. The first end has a first cross-sectional area, the second end has a second cross-sectional area, and the first cross-sectional area is smaller than the second cross-sectional area. With the semiconductor structure 100 provided in the present disclosure, the hollow dielectric layer 130 between the first metal lines 121 of the first metal layer 120 is effectively protected by disposing the dielectric landing layer 140 between the first metal layer 120 and the hollow dielectric layer 130, thereby enhancing the reliability of the semiconductor structure 100.

Figure 4:
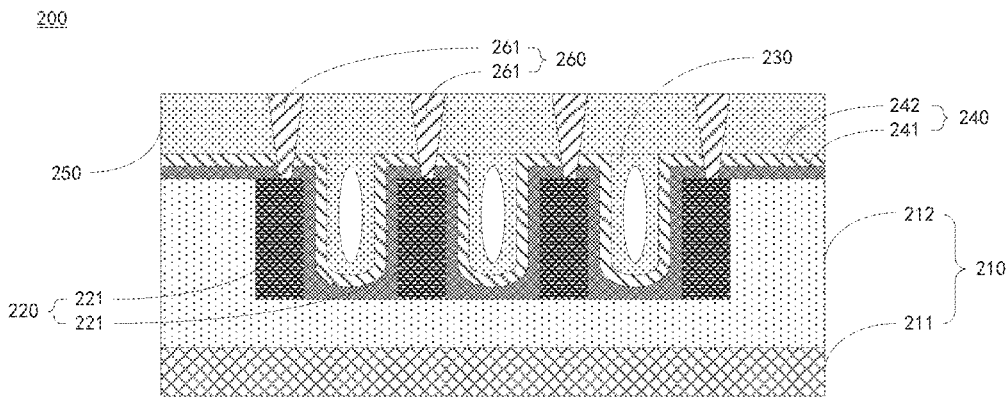
FIG. 4 is a sectional structure diagram of a semiconductor structure provided in a second implementation of the present disclosure.

Referring to FIG. 4, which shows a structure diagram of a semiconductor structure 200 provided in the second implementation of the present disclosure. Constituent parts and relative position relationships among the constituent parts according to the second implementation of the present disclosure can be seen in the figure intuitively.

As shown in FIG. 4, the second implementation is substantially the same as the first implementation in terms of structure, in which the base 210 (including substrate 211 and dielectric layer 212) in the second implementation is same as the base 110 (including substrate 111 and dielectric layer 112) in the first implementation in terms of the function and disposing position; the first metal layer 220 (including a plurality of first metal lines 221) in the second implementation is same as the first metal layer 120 (including a plurality of first metal lines 121) in the first implementation in terms of the function and disposing position; the hollow dielectric layer 230 in the second implementation is same as the hollow dielectric layer 130 in the first implementation in terms of the function and disposing position; the dielectric landing layer 240 in the second implementation is same as the dielectric landing layer 140 in the first implementation in terms of the function and disposing position; the interlayer dielectric layer 250 in the second implementation is same as the interlayer dielectric layer 150 in the first implementation in terms of the function and disposing position; and the second metal layer 260 in the second implementation is same as the second metal layer 160 in the first implementation in terms of the function and disposing position.

Differences lie in that, in this implementation, the dielectric landing layer 240 includes a first dielectric landing layer 241 and a second dielectric landing layer 242 over the first dielectric landing layer 241. During etching the interlayer dielectric layer 250 and the first dielectric landing layer 241, there is a first etch selectivity ratio between the interlayer dielectric layer 250 and the first dielectric landing layer 241, and there is a second etch selectivity ratio between the interlayer dielectric layer 250 and the second dielectric landing layer 242, wherein the first etch selectivity ratio is less than the second etch selectivity ratio. That is, under the same etch conditions, the etch speed for the interlayer dielectric layer 150 is faster than that for the first dielectric landing layer 241 and the etch speed for the first dielectric landing layer 241 is faster than that for the second dielectric landing layer 242.

It is easy to understand that the hollow dielectric layer 230 may be protected more efficiently since the dielectric landing layer 240 is a multilayer structure in this implementation. Furthermore, in an example according to the present disclosure, each of the first metal lines 221 has a first end 221-1 in contact with the base and a second end 221-2 in contact with the dielectric landing layer. The second end 221-2 is wider than the first end 221-1 (that is, the first metal line is an inverted trapezoidal, and in this case the hollow dielectric layer between adjacent first metal lines is a regular trapezoidal with a narrow top and wide bottom). When the trenches of the second metal vias are over etched in order to ensure that the second metal vias are connected with the corresponding first metal lines, and an alignment deviation occurs between the second metal vias and the corresponding first metal lines, since they are now under the environment of etching the interlayer dielectric layer, the etch speed slows down when the etch solution reaches the dielectric landing layer, which prevents the trenches of the second metal vias from sinking into the dielectric landing layer. In addition, the inverted trapezoidal structure of the first metal lines further prevents the trenches of the second metal vias from contacting the hollow dielectric layer between the first metal lines, thereby protecting the hollow dielectric layer. And in this implementation, the etch speed for the trenches of the second metal vias decreases gradually without any abrupt change and the etch speed for trenches of the second metal vias may be reduced to a greater extent.

Figure 5:
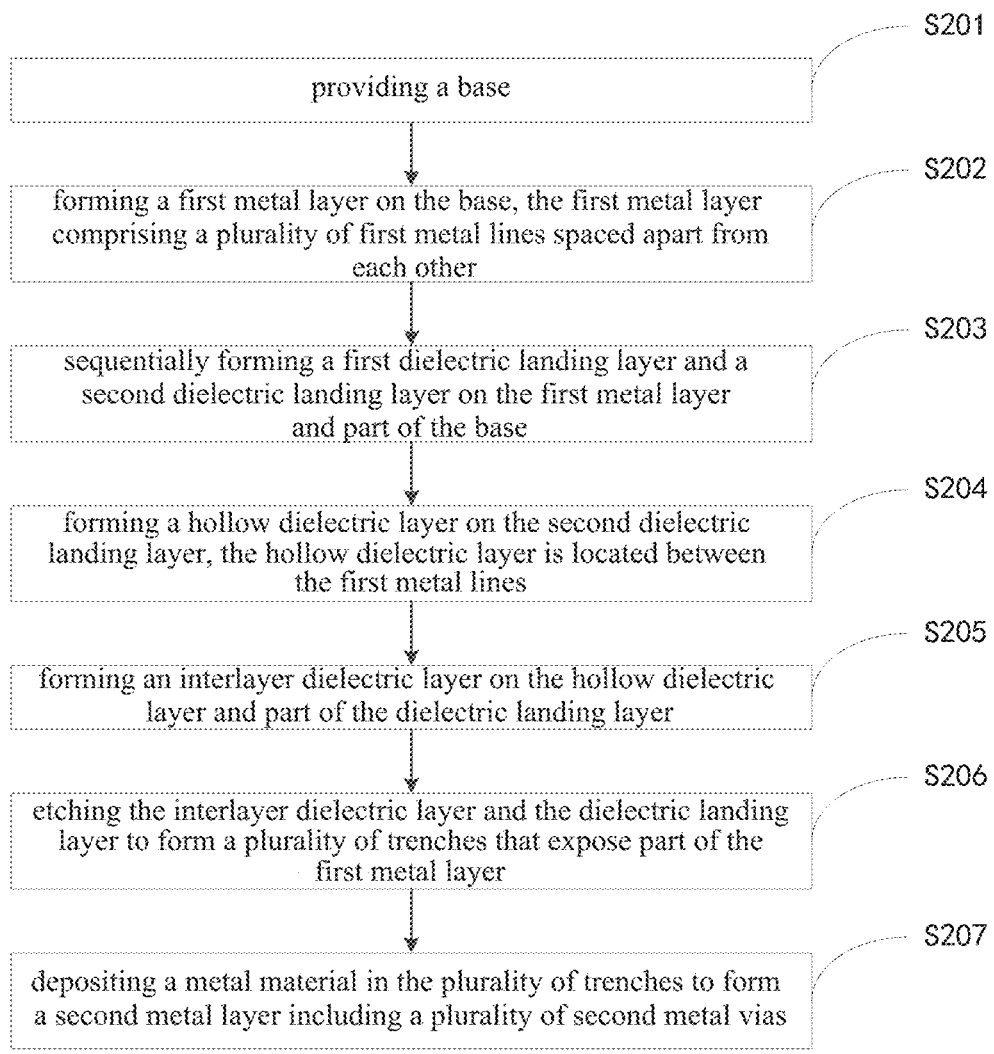
FIG. 5 is a flow chart of a manufacturing method of the semiconductor structure provided in the second implementation of the present disclosure.
Figure 6A:
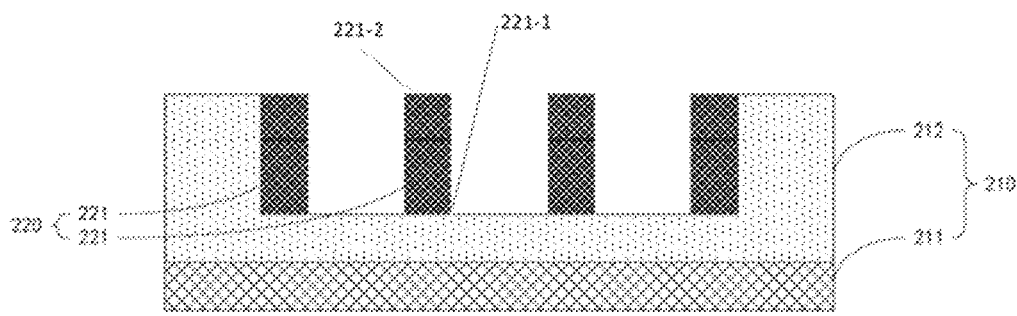
FIGS. 6a-6e are process flow charts of a manufacturing method of the semiconductor structure provided in the second implementation of the present disclosure.
Figure 6B:
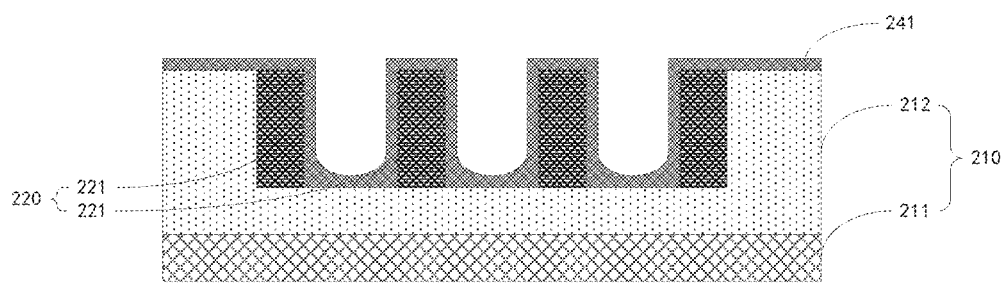
Figure 6C:
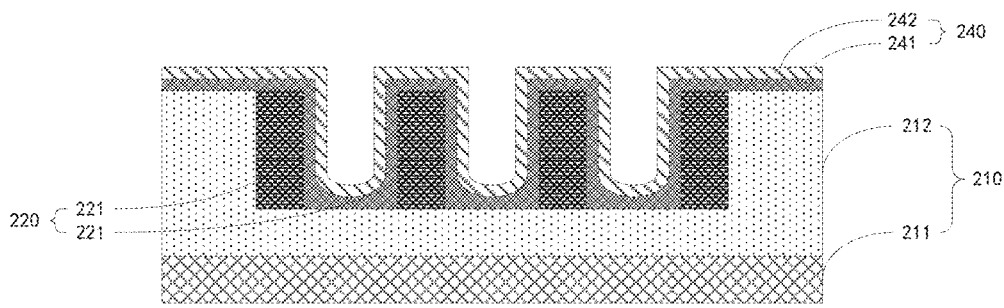
Figure 6D:
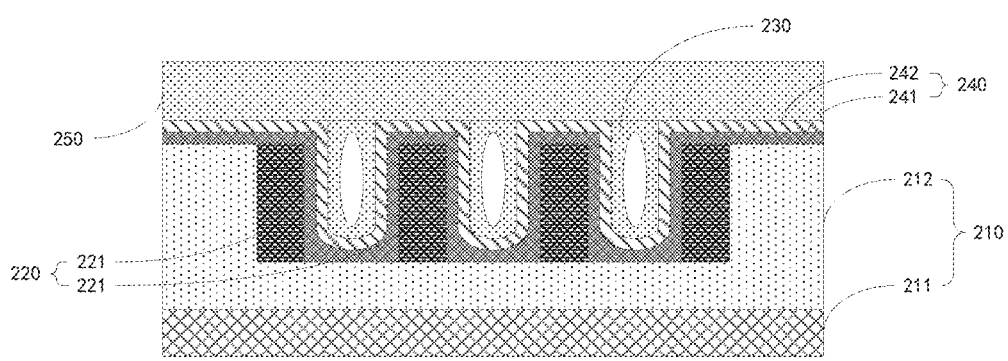
Figure 6E:
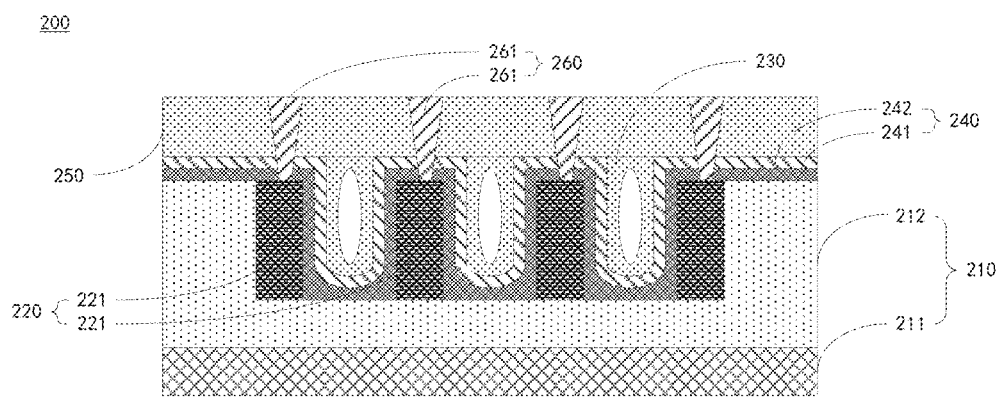

Referring to FIGS. 5 and 6a-6e, FIG. 5 is a flow chart of a manufacturing method of the semiconductor structure 200 provided in the second implementation of the present disclosure, and FIGS. 6a-6e are process flow charts of the manufacturing method of the semiconductor structure 200 provided in the second implementation of the present disclosure. As shown in FIG. 5, the manufacturing method of the semiconductor structure 200 includes a base providing step S201: providing a base 210; a first metal layer forming step S202: forming a first metal layer 220 on the base 210, the first metal layer 220 including a plurality of first metal lines 221 spaced apart from each other; a dielectric landing layer forming step S203: sequentially forming a first dielectric landing layer 241 and a second dielectric landing layer 242 on the first metal layer 220 and part of the base 210; a hollow dielectric layer forming step S204: forming a hollow dielectric layer 230 on the second dielectric landing layer 242, and the hollow dielectric layer 230 is located between the first metal lines 221; an interlayer dielectric layer forming step S205: forming an interlayer dielectric layer 250 on the hollow dielectric layer 230 and part of the dielectric landing layer 240; a trench etching step S206: etching the interlayer dielectric layer 250 and the dielectric landing layer 240 to form a plurality of trenches that expose part of the first metal layer 220; and a second metal layer forming step S207: depositing metal material in the plurality of trenches to form a second metal layer 260 including a plurality of second metal vias 261.

In some implementations, each of the first metal lines 221 has a first end 221-1 in contact with the base and a second end 221-2 in contact with the dielectric landing layer. The first end 221-1 is narrower than the second end 221-2.

The present disclosure provides a semiconductor structure 200 including: a base 210; a first metal layer 220 disposed on the base 210 and including a plurality of first metal lines 221 spaced apart from each other; a hollow dielectric layer 230 disposed on the base 210 and located between the first metal lines 221; and a dielectric landing layer 240 disposed between the first metal layer 220 and the hollow dielectric layer 230 and between part of the base 210 and the hollow dielectric layer 230, and the dielectric landing layer 240 including a first dielectric landing layer 241 and a second dielectric landing layer 242 with different materials. With the semiconductor structure 200 provided in the present disclosure, the hollow dielectric layer 230 between the first metal lines 221 of the first metal layer 220 is effectively protected by disposing the dielectric landing layer 240 between the first metal layer 220 and the hollow dielectric layer 230, thereby enhancing the reliability of the semiconductor structure 200.

In addition to the above-described implementations, the disclosure may have other implementations. All the technical solutions conceived through identical or equivalent substitutions fall within the scope claimed by the present disclosure.

In summary, the present disclosure has disclosed the preferred implementations above, however, the preferred implementations above are not used to limit the present disclosure. Various changes and modifications may be made by those of ordinary skills in the art without departing from the spirit and scope of the present disclosure.

What is claimed is:

1. A method for forming a semiconductor structure, comprising:
    forming a base comprising a substrate and a dielectric layer on the substrate;
    forming a first metal layer on the base, wherein the first metal layer comprises a plurality of first metal lines spaced apart from each other and partially covers the base;
    forming a dielectric landing layer to cover top surfaces and sidewalls of the plurality of first metal lines;
    forming a hollow dielectric layer on the dielectric landing layer between adjacent first metal lines, a step coverage of the hollow dielectric layer being smaller than a step coverage of the dielectric landing layer;
    forming an interlayer dielectric layer to cover top surfaces of the hollow dielectric layer and the dielectric landing layer;
    etching the interlayer dielectric layer and the dielectric landing layer to form a plurality of trenches that expose the plurality of first metal lines; and
    depositing a metal material in the plurality of trenches to form a second metal layer comprising a plurality of second metal vias.

2. The method of claim 1, wherein forming the hollow dielectric layer comprises forming a plurality of air gaps, each one of the plurality of air gaps being positioned between two adjacent first metal lines.

3. The method of claim 1, wherein each of the plurality of first metal lines has a first end in contact with the base and a second end in contact with the dielectric landing layer, the first end has a first cross-sectional area, the second end has a second cross-sectional area, and the first cross-sectional area is smaller than the second cross-sectional area.

4. The method of claim 1, wherein under a same etching condition, the interlayer dielectric layer has an etch rate larger than that of the dielectric landing layer.

5. The method of claim 2, wherein none of the plurality of second metal vias extends into any one of the plurality of air gaps.

6. The method of claim 1, wherein a bottom surface of at least one of the plurality of second metal vias is at least partially landed on the dielectric landing layer.

7. The method of claim 1, wherein a first subset of the plurality of second metal vias is in contact with the plurality of first metal lines.

8. The method of claim 6, wherein a second subset of the plurality of second metal vias deviates from contacting the plurality of first metal lines, and the plurality of second metal vias are in contact with the dielectric landing layer.

9. The method of claim 1, wherein the interlayer dielectric layer has a same material as the hollow dielectric layer.

10. The method of claim 1, wherein the interlayer dielectric layer has a different material from the hollow dielectric layer.

11. The method of claim 1, wherein:
    the smaller step coverage of the hollow dielectric layer is configured to limit deposition of a material of the hollow dielectric layer between adjacent ones of the first metal lines, thereby forming an air gap.

12. The method of claim 11, wherein:
    the greater step coverage of the dielectric landing layer is configured to facilitate deposition of the dielectric landing layer over and along sides of the first metal lines.

13. The method of claim 1, wherein:
    the interlayer dielectric layer is fully filled between adjacent ones of the plurality of second metal vias.

14. The method of claim 1, wherein:
    one of the plurality of first metal lines has a side cross-sectional shape of an inverted trapezoid.

15. The method of claim 1, wherein:
    the hollow dielectric layer between adjacent ones of the first metal lines has a side cross-sectional shape of a regular trapezoid.

16. The method of claim 1, wherein:
    one of the second metal vias is configured to extend through the interlayer dielectric layer and the dielectric landing layer to have direct contact with a corresponding first metal line.

17. The method of claim 1, wherein:
    forming the dielectric landing layer comprises forming part of the dielectric landing layer to cover the dielectric layer of the base.

18. The method of claim 17, wherein:
    forming the interlayer dielectric layer comprises forming part of the interlayer dielectric layer to cover the part of the dielectric landing layer on the dielectric layer of the base.

* * * * *